(12) United States Patent
Rembold et al.

(10) Patent No.: US 6,257,327 B1
(45) Date of Patent: Jul. 10, 2001

(54) HEAT SINK INCLUDING PEDESTAL

(75) Inventors: Dale Rembold, Portland, OR (US); Michael R. McDonald, Lacey, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 08/912,249

(22) Filed: Aug. 15, 1997

(51) Int. Cl.[7] .................................................. F28F 7/00
(52) U.S. Cl. ..................... 165/185; 165/80.3; 361/703; 174/16.3; 257/722
(58) Field of Search ................... 165/80.3, 185; 174/16.3; 257/722, 718, 719; 361/697, 709, 710, 711, 700, 703

(56) References Cited

U.S. PATENT DOCUMENTS

| 4,535,385 | * | 8/1985 | August et al. ................. 361/711 |
| 4,802,532 | * | 2/1989 | Dawes et al. ................. 361/710 X |
| 5,132,780 | * | 7/1992 | Higgins, III ................. 165/185 X |
| 5,168,926 | * | 12/1992 | Watson et al. ................. 165/185 |
| 5,172,755 | * | 12/1992 | Samarov ................. 165/185 X |
| 5,270,902 | * | 12/1993 | Bellar et al. ................. 165/185 X |
| 5,307,236 | * | 4/1994 | Rio et al. ................. 165/80.3 X |
| 5,367,193 | * | 11/1994 | Malladi ................. 361/709 X |
| 5,424,580 | * | 6/1995 | Tustaniwskyj et al. ......... 361/709 X |
| 5,574,626 | * | 11/1996 | Smith ................. 165/80.3 X |
| 5,638,895 | * | 6/1997 | Dodson ................. 165/80.3 X |
| 5,654,587 | * | 8/1997 | Schneider et al. ............ 165/80.3 X |
| 5,740,014 | * | 4/1998 | Lin ................. 165/80.3 X |
| 5,747,876 | * | 5/1998 | Majumdar et al. ............ 361/709 X |
| 5,784,254 | * | 7/1998 | Stephan et al. ................. 165/80.3 X |
| 5,808,236 | * | 9/1998 | Brezina et al. ................. 165/80.3 X |
| 5,847,452 | * | 12/1998 | Tantoush ................. 361/709 X |
| 5,875,096 | * | 2/1999 | Gates ................. 165/80.3 X |

FOREIGN PATENT DOCUMENTS

| 0143262 | * | 6/1985 | (EP) | ..................................... 361/710 |
| 354128278 | * | 10/1979 | (JP) | ..................................... 257/722 |
| 83217476 | | 12/1994 | (TW) | . |

OTHER PUBLICATIONS

Ostergren et al., Conduction Cooling Structure for Solder–Bonded Semiconductor Devices, IBM Technical Disclosure Bulletin, vol. 23, No. 8, pp. 3733–3734, Jan. 1981.*

* cited by examiner

Primary Examiner—Christopher Atkinson
(74) Attorney, Agent, or Firm—Blakely, Sokoloff, Taylor & Zafman LLP

(57) ABSTRACT

A heat sink including a pedestal. The heat sink is used to dissipate heat from an electrical component such as a processor (e.g., a Pentium® Pro processor). The pedestal is arranged on the heat sink such that a gap which is formed between a surface of the electrical component and the heat sink is maintained to be less than an acceptable gap size. The gap between the heat sink and the electrical component can occur, for example, due to excessive warping of a surface of the electrical component. The excessive warping can be caused, for example, from manufacturing process problems or thermal changes. The pedestal can be arranged on an end of the heat sink facing the electrical component in a manner advantageous to cover a maximum surface area of the electrical component caused due to a particular size and shape of warping which uniquely occurs on a particular type of electrical component. For example, the pedestal may be arranged in a center portion of the end of the heat sink facing the electrical component.

15 Claims, 5 Drawing Sheets

HEAT SINK INCLUDING PEDESTAL

BACKGROUND OF THE INVENTION

The present invention relates to heat sinks. More particularly, the present invention relates to heat sinks which provide appropriate dissipation of heat from devices such as electrical components.

Heat sinks have previously been provided to dissipate heat from electrical components. The electrical component typically has a flat top surface on which the heat sink is placed. Heat produced by the electrical component is efficiently dissipated using the heat sink since the heat sinks typically have a flat surface on the bottom extending over the entire surface of and which rests on the flat top surface of the electrical component. However, the electrical component can become excessively warped due to manufacturing process problems and/or due to thermal changes. The warping of the electrical component is typically concave on the top surface to form a dish-like surface. However, due to the excessive warping of the top surface of the electrical component, an unacceptable gap is formed between the top surface of the electrical component and the bottom surface of the heat sink, since the top surface of the electrical component is warped and the bottom surface of the heat sink is flat. Additionally, if the gap is larger than the thermal interface characteristics can support, the cooling solution fails. That is, large gaps can result between the electrical component and the heat sink due to thermal interface coverage (for example, due to grease voids) in manufacturing processes and excessive thermal interface loss. The thermal interface efficiency, such as grease, requires minimizing the thickness of the gap between the electrical component and the heat sink.

SUMMARY OF THE INVENTION

The present invention relates to a heat sink including a pedestal.

DETAILED DESCRIPTION

Figure 1:
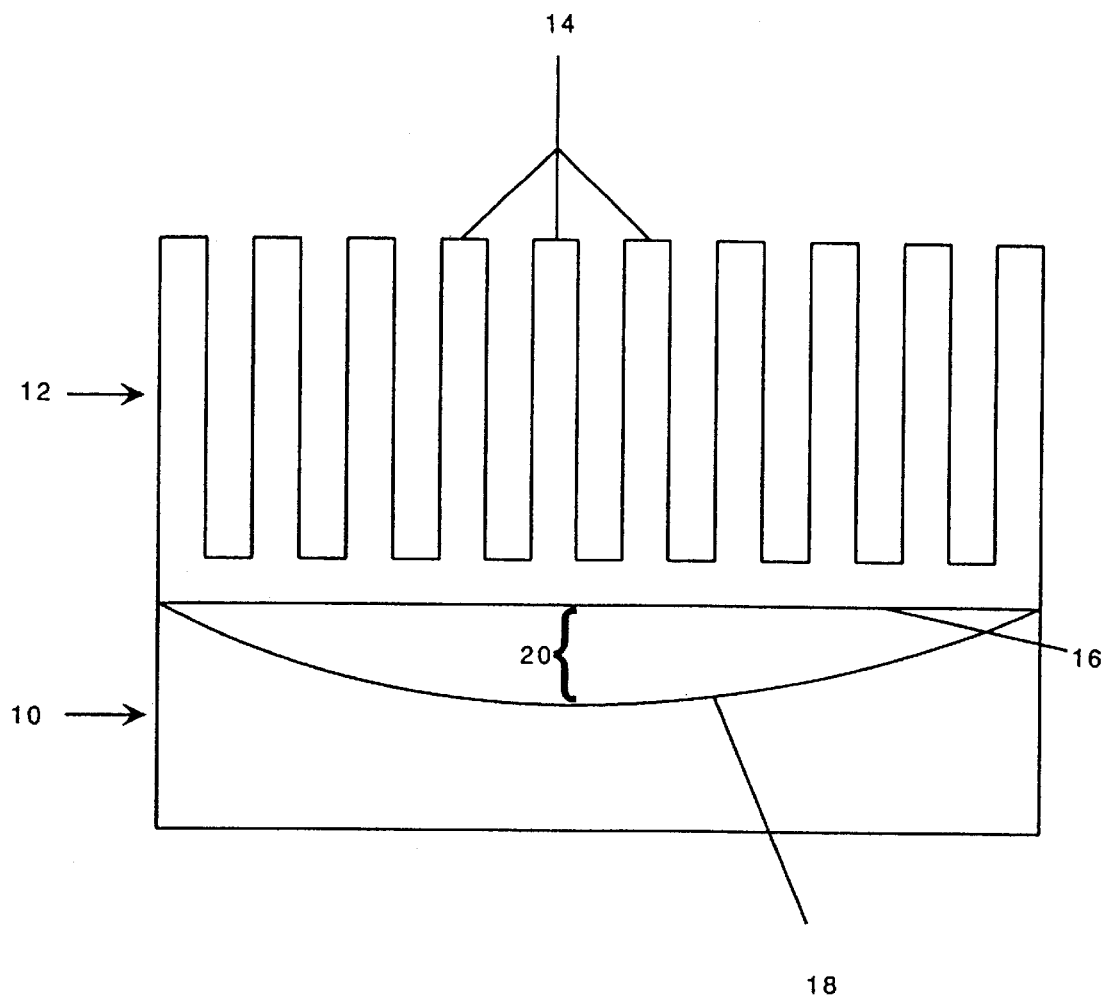
FIG. 1 illustrates a heat sink positioned to dissipate heat from an electrical device.

FIG. 1 illustrates an electrical component 10 and a heat sink 12 provided on electrical component 10. Electrical component 10 can be any electrical device which produces heat. In one embodiment, electrical component 10 can be a PENTIUM® PRO processor made by Intel Corporation. Alternatively, electrical component 10 can be any processor made by Intel Corporation or any other processor.

Heat sink 12 includes a plurality of fins 14 which are arranged to dissipate heat away from electrical component 10. A bottom edge 16 of heat sink 12 is flat so that it is arranged on a top surface 18 of electrical component 10. The top surface of component 10 is typically initially flat. However, the top surface 18 of electrical component 10 can be excessively warped due to-component manufacturing processes and/or due to thermal changes. This warping causes top surface 18 to be formed in a concave dish-like surface as illustrated in FIG. 1. Due to the warping of top surface 18, a gap 20 forms between top surface 18 of electrical component 10 and bottom edge 16 of heat sink 12. An example of an unacceptable gap limit may be, for example 10 mil (0.01 inches). An example of an acceptable gap limit is a range of 2–7 mil (where 2 mil is the target and 7 mil is the absolute maximum allowed). Another example of an acceptable gap limit is a range of 5–7 mil (where 5 mil is the target and 7 mil is the absolute maximum allowed). Other acceptable and unacceptable gap limit values may be used in implementing embodiments of the present invention according to particular preferences in particular embodiments or with particular electrical components.

As the size of the gap 20 extends beyond the acceptable gap limit, heat conductivity from electrical component 10 to heat sink 12 is reduced.

Figure 2:
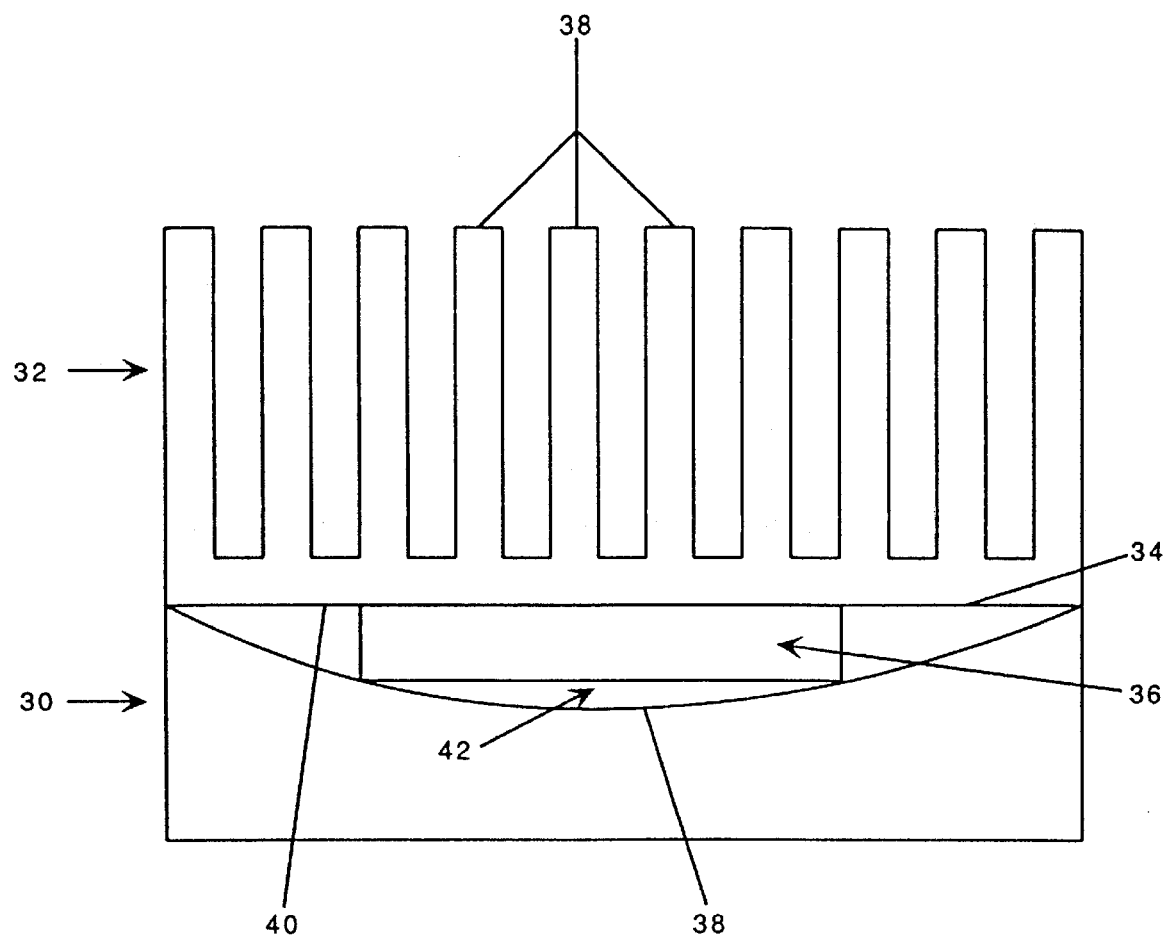
FIG. 2 illustrates a heat sink including a pedestal to dissipate heat from an electrical device according to an exemplary embodiment of the present invention.

FIG. 2 illustrates an electrical component 30 and a heat sink 32 provided on electrical component 30. Electrical component 30 can be any electrical device which produces heat. In one embodiment, electrical component 30 can be a PENTIUM® PRO processor made by Intel Corporation. Alternatively, electrical component 30 can be any processor made by Intel Corporation or any other processor.

Heat sink 32 includes a body 34 and a pedestal 36. Body 34 includes a plurality of fins 38 which are arranged to dissipate heat away from electrical component 30. According to an embodiment of the present invention, body 34 and pedestal 36 of heat sink 32 may be made of various grades of aluminum such as cast aluminum or extruded aluminum. According to embodiments of the present invention, body 34 and pedestal 36 of heat sink 32 may be made of any material, particularly materials which provide good heat dissipation. According to embodiments of the present invention, body 34 and pedestal 36 may be made of the same material or may be made of different materials.

Figure 3:
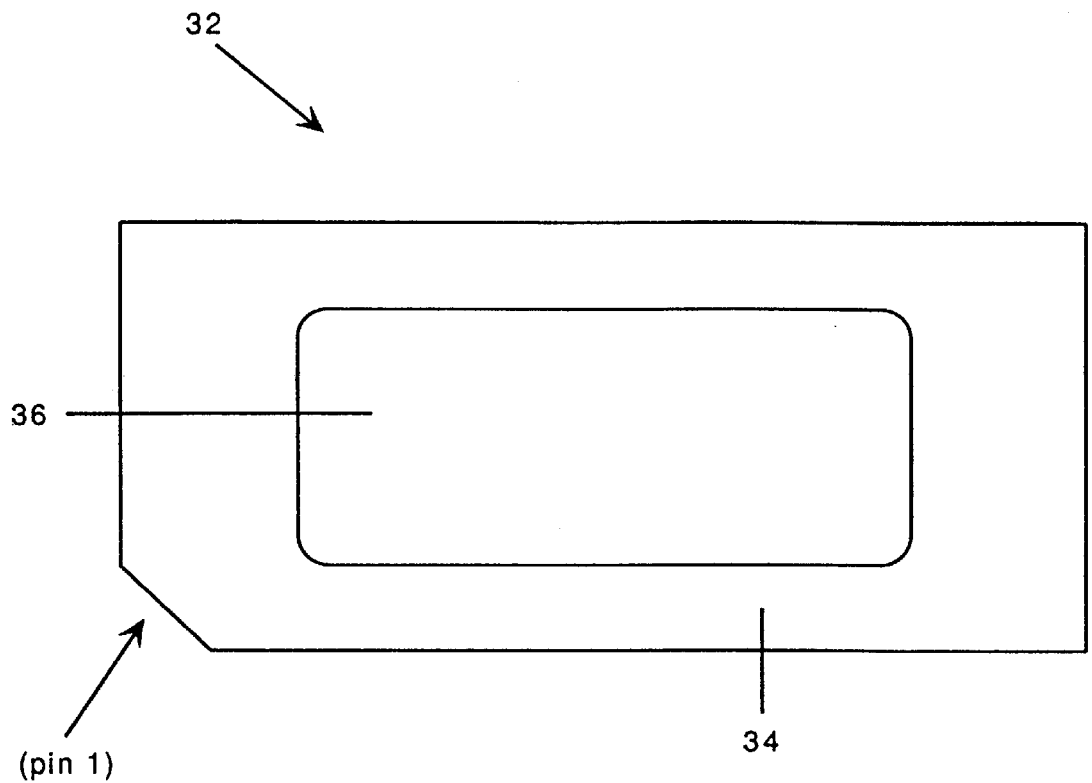
FIG. 3 illustrates a bottom view of the heat sink illustrated in FIG. 2 according to an exemplary embodiment of the present invention.

A bottom edge 40 of body 34 is arranged on top of pedestal 36. A top surface 38 of component 30 is typically initially flat. However, the top surface 38 of electrical component 30 can become excessively warped due to the electrical component manufacturing process and/or due to thermal conditions. This warping causes top surface 38 to be formed in a concave dish-like surface as illustrated in FIG. 2 similar to the warping of top surface 18 of electrical component 10 illustrated in FIG. 1. Due to the warping of top surface 38, a gap 42 forms between top surface 38 of electrical component 10 and a bottom edge of pedestal 36. Even if the top surface 38 warps an excessive amount, the gap 42 will not represent a value greater than an acceptable gap limit. An example of an unacceptable gap limit may be, for example 10 mil (0.01 inches). An example of an acceptable gap limit is a range of 2–7 mil (where 2 mil is the target and 7 mil is the absolute maximum). Another example of an acceptable gap limit is a range of 5–7 mil (where 5 mil is the target and 7 mil is the absolute maximum). Due to the arrangement of the pedestal 36 of the heat sink 32, the gap 42 is reduced to the acceptable gap limit. Other acceptable and unacceptable gap limit values may be used in implementing embodiments of the present invention according to particular preferences in particular embodiments or with particular electrical components. FIG. 3 illustrates a bottom view of the heat sink 32 illustrated in FIG. 2. In the embodiment illustrated in FIG. 3 pedestal 36 is arranged in a center portion of the bottom edge 40 of body 34 of heat sink 32.

The pedestal 36 of heat sink 32 is illustrated as being arranged in a center portion of the bottom edge 40 of body 34. Due to its size and shape, pedestal 36 extends below surface 40 into the space between surface 40 and warped surface 38 so that the size of gap 42 does not become larger than an acceptable gap limit value. For example, the maximum value of the size of gap 42 may be 5 mil (0.005 inches) or less or may be 7 mil or less, or may be 2 mil or less.

Figure 4:
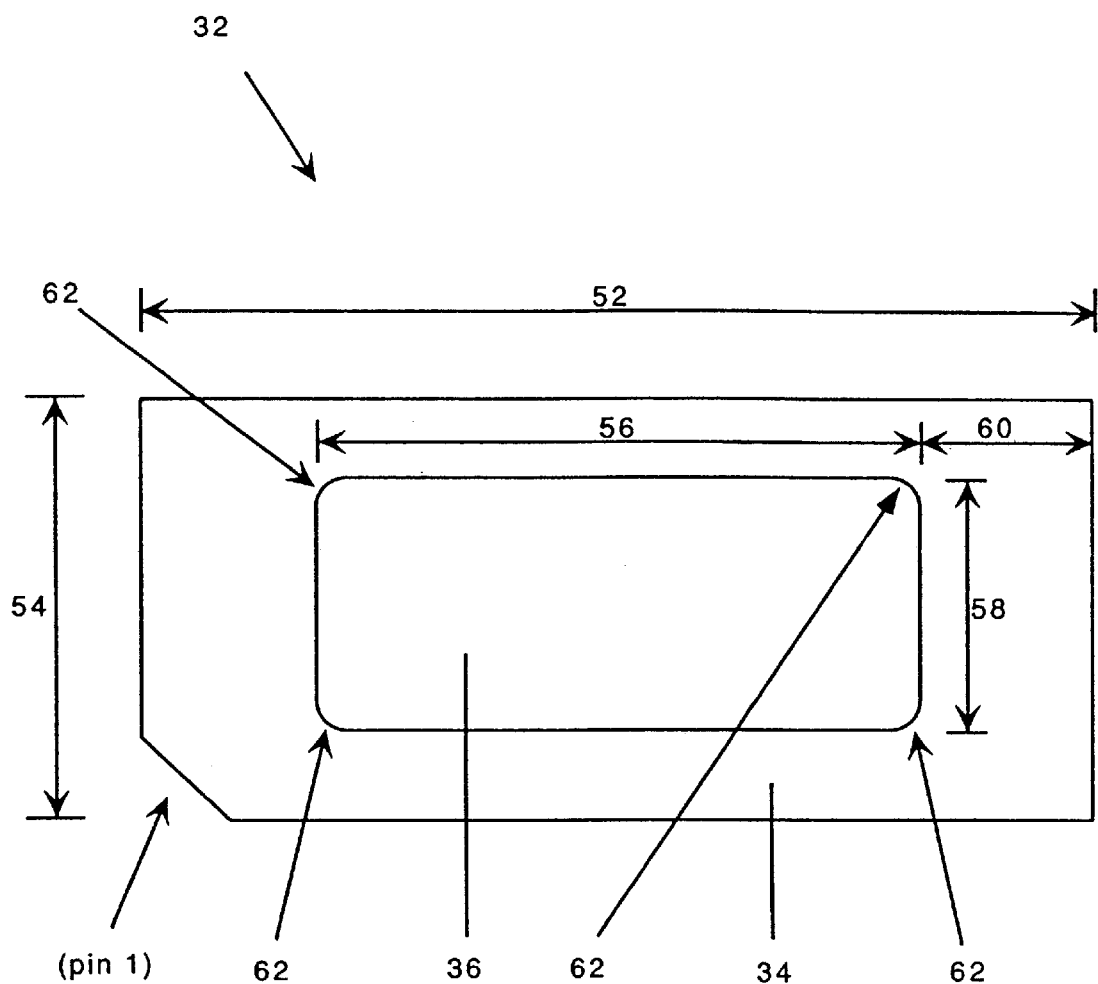
FIG. 4 illustrates values for sizes of various portions of a heat sink according to an exemplary embodiment of the present invention.

In an embodiment of the present invention as illustrated in FIG. 4, a length 52 of the body 34 of the heat sink 32 is approximately in a range of 3.195 inches to 3.205 inches, or approximately 3.2 inches (or approximately 3.2 inches maximum), or so approximately 2.66 inches or approximately 3 inches (or approximately 3 inches maximum), and a width 54 of the body 34 of heat sink 32 is approximately in a range of 2.5 inches to 3.0 inches, or approximately 2.46 inches, or approximately 3 inches (or approximately a maximum of 3 inches), a length 56 of the pedestal 36 is approximately 2.1 inches (or approximately 2.1 inches maximum) and a width 58 of pedestal 36 is approximately 1.3 inches (or approximately 1.3 inches maximum), a distance 60 between an edge of body 34 and an edge of pedestal 36 is approximately 0.27 inches, and a flatness (not illustrated) of pedestal 36 is approximately 1 mil per linear inch. A radius of the corners 62 of pedestal 36 is approximately 0.3 inches. An approximate depth of the pedestal 36 in an embodiment of the present invention is approximately 30 thousandths (or 0.03 inches). An approximate value of the surface area of the bottom of pedestal 36 is approximately 2.65 square inches or approximately 2.73 square inches, or approximately 2.7 square inches, or approximately in a range of 2.6 square inches to 2.8 square inches. Pedestal 36 is approximately positioned in a center of bottom edge 40 of body 34. Additionally, in an alternative embodiment of the present invention the bottom of pedestal 36 is not approximately flat but is curved or otherwise shaped in a manner to advantageously follow the warped top surface 38 of electrical component 30 to further reduce the gap between the electrical component and the pedestal of the heat sink.

The approximate measurements illustrated in FIG. 4 and described in connection thereto are particularly advantageous for a PENTIUM® PRO processor heat sink. However, a heat sink having these approximate measurements could also be used for a heat sink used to dissipate heat from another processor or another electrical component other than a PENTIUM® PRO processor according to embodiments of the present invention.

The size and shape of pedestal 36 can be advantageously modified based on different particular electrical components 30 from which heat is being dissipated. In an exemplary embodiment of the present invention, the pedestal 36 is arranged in a center portion of the bottom surface 40 of the body 34 of the heat sink 32. In another embodiment of the present invention, the pedestal 36 can be formed of a plurality of legs (for example, two legs or four legs) extending from the bottom surface 40 of body 34 in a manner such that the gap between the pedestal legs and the warped top surface of the electrical component is minimized. According to other embodiments of the present invention, the pedestal 36 is formed in any shape, size or position relative to the body of the heat sink such that a gap between the heat sink and the electrical component occurring due to warping or other deformation of the surface of the electrical component can be minimized. For example, the bottom of the pedestal may be curved to ensure greater contact between the bottom edge of the pedestal and the warped surface of the electrical component. In an additional embodiment of the present invention, a fan or a plurality of fans may be provided on top of heat sink 32 to further enable heat dissipation.

Figure 5:
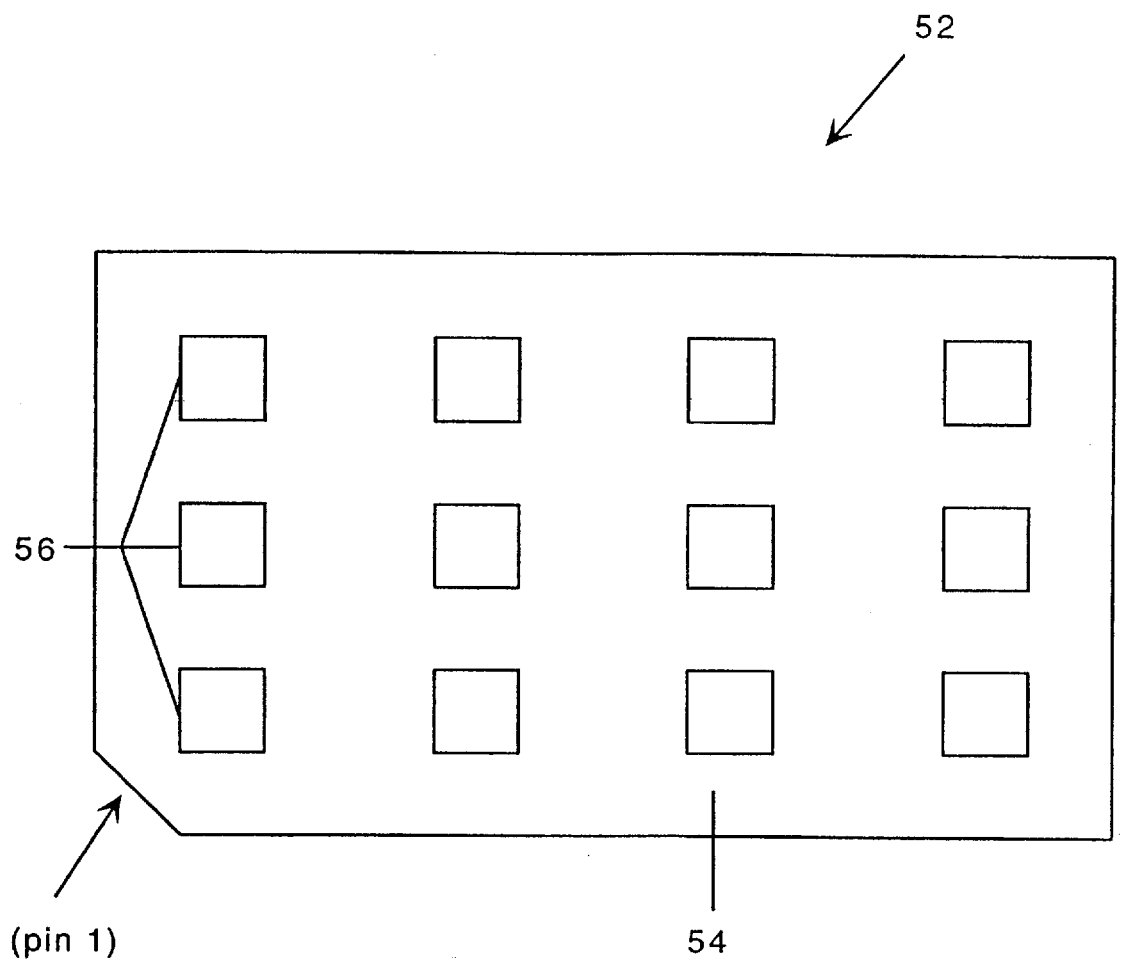
FIG. 5 illustrates a bottom view of the heat sink illustrated in FIG. 2 according to an exemplary embodiment of the present invention wherein the pedestal comprises a plurality of legs.

FIG. 5 illustrates a bottom view of the heat sink 52 illustrated in FIG. 2 according to an exemplary embodiment of the present invention wherein the pedestal comprises a plurality of legs. In the embodiment illustrated in FIG. 5 legs 56 that form the pedestal are arranged in a center portion of the bottom edge of body 54 of heat sink 52.

The legs 56 forming the pedestal of heat sink 52 are illustrated as being arranged in a center portion of the bottom edge of body 54. Due to the size and shape of legs 56, the pedestal extends below surface 40 into the space between surface 40 and warped surface 38 so that the size if gap 42 does not become larger than an acceptable gap limit value. For example, the maximum value of the size of gap 42 may be 5 mil (0.005 inches) or less or may be 7 mil or less, or may be 2 mil or less.

Although the electrical component has been described herein as being a PENTIUM® PRO processor or any other processor, it is noted that the heat sink according to embodiments of the present invention may be used to dissipate heat from any electrical component or any other device from which it is desired to dissipate heat.

What is claimed is:

1. A heat sink comprising:

a body having a bottom surface with a length and a width; and a pedestal on the bottom surface of the body, the pedestal having a length and a width that is less than the length and the width of the bottom surface of the body and having a smaller surface area than a top surface of an electrical component to be cooled, the pedestal to be disposed between the bottom surface of the body and a concave dish-like warped upper surface of the electrical component to reduce a gap formed therebetween.

2. The heat sink according to claim 1, further comprising a plurality of fins.

3. The heat sink according to claim 1, wherein the electrical component is a processor.

4. The heat sink according to claim 1, wherein the length of the pedestal is approximately in a range of 70% to 90% of the length of the bottom surface of the body.

5. The heat sink according to claim 1, wherein the length of the pedestal is approximately 80% of the length of the bottom surface of the body.

6. The heat sink according to claim 5, wherein the length of the bottom surface of the body is in a range of approximately 2.5 inches to 3.5 inches and the length of the pedestal is in a range of approximately 2.0 inches to 2.5 inches.

7. The heat sink according to claim 6, wherein the length of the bottom surface of the body is approximately 2.66 inches and the length of the pedestal is approximately 2.1 inches.

8. The heat sink according to claim 1, wherein the surface area of the pedestal is approximately 2.65 square inches.

9. The heat sink according to claim 1, wherein the bottom surface of the body has a surface area approximately range of 6.0 inches to 6.5 inches.

10. The heat sink according to claim 1, wherein the body and the pedestal of the heat sink are made of aluminum.

11. An apparatus comprising:

an electrical component having a concave dish-like warped upper surface; and a heat sink including a body having:

a bottom surface with a length and a width, and a pedestal to be disposed between the bottom surface of the heat sink body and the concave dish-like warped upper surface of the electrical component to reduce a gap formed therebetween, the pedestal having a length and a width less than the length and the width of the bottom surface of the heat sink body, and having a smaller surface area than the concave dish-like warped upper surface of the electrical component.

12. The apparatus according to claim 11, wherein the electrical component is a processor.

13. The apparatus according to claim 11, wherein the heat sink is made of aluminum.

14. The apparatus according to claim 11, wherein the heat sink further comprises a plurality of fins.

15. The heat sink according to claim 11, wherein the length of the pedestal is approximately in a range of 70% to 90% of the length of the bottom surface of the body.

* * * * *